(12) United States Patent
Antonelli et al.

(10) Patent No.: US 8,557,712 B1
(45) Date of Patent: Oct. 15, 2013

(54) PECVD FLOWABLE DIELECTRIC GAP FILL

(75) Inventors: George Andrew Antonelli, Portland, OR (US); Bart Van Schravendijk, Sunnyvale, CA (US)

(73) Assignee: Novellus Systems, Inc., Fremont, CA (US)

( * ) Notice: Subject to any disclaimer, the term of this patent is extended or adjusted under 35 U.S.C. 154(b) by 0 days.

(21) Appl. No.: 12/334,726

(22) Filed: Dec. 15, 2008

(51) Int. Cl.
*H01L 21/312* (2006.01)

(52) U.S. Cl.
USPC ....... 438/761; 257/E21.26; 427/489; 438/789

(58) Field of Classification Search
USPC ............. 257/E21.26–E21.263; 427/489, 579; 438/761, 780, 781, 789
See application file for complete search history.

(56) References Cited

U.S. PATENT DOCUMENTS

| | | | |
|---|---|---|---|
| 4,099,990 A | 7/1978 | Brown et al. |
| 4,740,480 A | 4/1988 | Ooka |
| 5,320,983 A | 6/1994 | Ouellet |
| 5,387,546 A | 2/1995 | Maeda et al. |
| 5,516,721 A | 5/1996 | Galli et al. |
| 5,534,731 A | 7/1996 | Cheung |
| 5,840,631 A | 11/1998 | Kubo et al. |
| 5,858,880 A | 1/1999 | Dobson et al. |
| 5,874,367 A | 2/1999 | Dobson |
| 5,899,751 A | 5/1999 | Chang et al. |
| 5,902,127 A | 5/1999 | Park |
| 5,932,289 A | 8/1999 | Dobson et al. |
| 6,013,581 A | 1/2000 | Wu et al. |
| 6,060,384 A | 5/2000 | Chen et al. |
| 6,114,259 A | 9/2000 | Sukharev et al. |
| 6,143,626 A | 11/2000 | Yabu et al. |
| 6,207,535 B1 | 3/2001 | Lee et al. |
| 6,218,268 B1 | 4/2001 | Xia et al. |
| 6,242,366 B1 | 6/2001 | Beekman et al. |
| 6,287,989 B1 | 9/2001 | Dobson |
| 6,300,219 B1 | 10/2001 | Doan et al. |
| 6,309,933 B1 | 10/2001 | Li et al. |

(Continued)

FOREIGN PATENT DOCUMENTS

WO 2011072143 6/2011

OTHER PUBLICATIONS

U.S. Office Action mailed Aug. 23, 2005, from U.S. Appl. No. 10/810,066.

(Continued)

*Primary Examiner* — Julio J Maldonado
*Assistant Examiner* — Daniel Shook
(74) *Attorney, Agent, or Firm* — Weaver Austin Villeneuve & Sampson LLP

(57) ABSTRACT

New methods of filling gaps with dielectric material are provided. The methods involve plasma-enhanced chemical vapor deposition (PECVD) of a flowable polymerized film in a gap, followed by an in-situ treatment to convert the film to a dielectric material. According to various embodiments, the in-situ treatment may be a purely thermal or plasma treatment process. Unlike conventional PECVD processes of solid material, which deposit film in a conformal process, the deposition results in bottom-up fill of the gap. In certain embodiments, a deposition-in situ treatment-deposition-in situ treatment process is performed to form dielectric layers in the gap. The sequence is repeated as necessary for bottom up fill of the gap. Also in certain embodiments, an ex-situ post-treatment process is performed after gap fill is completed. The processes are applicable to frontend and backend gapfill.

21 Claims, 10 Drawing Sheets

(56) References Cited

U.S. PATENT DOCUMENTS

| | | | |
|---|---|---|---|
| 6,383,951 B1 | 5/2002 | Li | |
| 6,399,213 B2 | 6/2002 | Shiokawa | |
| 6,413,583 B1* | 7/2002 | Moghadam et al. | 427/249.15 |
| 6,475,564 B1 | 11/2002 | Carter et al. | |
| 6,544,858 B1 | 4/2003 | Beekman et al. | |
| 6,640,840 B1 | 11/2003 | MacNeil | |
| 6,653,247 B2 | 11/2003 | MacNeil | |
| 6,743,436 B1 | 6/2004 | Lee et al. | |
| 6,743,736 B2 | 6/2004 | Mardian et al. | |
| 6,787,463 B2 | 9/2004 | Mardian et al. | |
| 6,790,737 B2 | 9/2004 | Schneegans et al. | |
| 6,828,162 B1 | 12/2004 | Halliyal et al. | |
| 6,846,757 B2 | 1/2005 | MacNeil | |
| 6,902,947 B2 | 6/2005 | Chinn et al. | |
| 6,984,561 B2 | 1/2006 | Herner et al. | |
| 7,033,945 B2 | 4/2006 | Byun et al. | |
| 7,056,560 B2* | 6/2006 | Yim et al. | 427/551 |
| 7,071,126 B2 | 7/2006 | Johnston et al. | |
| 7,074,690 B1 | 7/2006 | Gauri et al. | |
| 7,153,783 B2 | 12/2006 | Lu et al. | |
| 7,238,604 B2 | 7/2007 | Kloster et al. | |
| 7,521,378 B2 | 4/2009 | Fucsko et al. | |
| 7,524,735 B1 | 4/2009 | Gauri et al. | |
| 7,582,555 B1 | 9/2009 | Lang et al. | |
| 7,585,704 B2 | 9/2009 | Belyansky et al. | |
| 7,622,369 B1 | 11/2009 | Lee et al. | |
| 7,629,198 B2 | 12/2009 | Kumar et al. | |
| 7,825,044 B2 | 11/2010 | Mallick et al. | |
| 7,888,233 B1 | 2/2011 | Gauri et al. | |
| 7,888,273 B1 | 2/2011 | Wang et al. | |
| 7,915,139 B1 | 3/2011 | Lang et al. | |
| 8,187,951 B1 | 5/2012 | Wang et al. | |
| 8,278,224 B1 | 10/2012 | Mui et al. | |
| 2002/0006729 A1 | 1/2002 | Geiger et al. | |
| 2003/0077887 A1 | 4/2003 | Jang et al. | |
| 2003/0146416 A1 | 8/2003 | Takei et al. | |
| 2003/0194861 A1 | 10/2003 | Mardian et al. | |
| 2004/0048455 A1 | 3/2004 | Karasawa et al. | |
| 2004/0152342 A1 | 8/2004 | Li et al. | |
| 2004/0224496 A1 | 11/2004 | Cui et al. | |
| 2005/0112282 A1 | 5/2005 | Gordon | |
| 2005/0136684 A1* | 6/2005 | Mukai et al. | 438/778 |
| 2005/0181566 A1 | 8/2005 | Machida et al. | |
| 2005/0260864 A1 | 11/2005 | Huang et al. | |
| 2006/0014384 A1 | 1/2006 | Lee et al. | |
| 2006/0024912 A1 | 2/2006 | Lee | |
| 2006/0216946 A1 | 9/2006 | Usami et al. | |
| 2006/0223290 A1 | 10/2006 | Belyansky et al. | |
| 2006/0269693 A1 | 11/2006 | Balseanu et al. | |
| 2006/0270217 A1 | 11/2006 | Balseanu et al. | |
| 2007/0054505 A1 | 3/2007 | Antonelli et al. | |
| 2007/0281495 A1* | 12/2007 | Mallick et al. | 438/778 |
| 2007/0298585 A1 | 12/2007 | Lubomirsky et al. | |
| 2008/0020591 A1 | 1/2008 | Balseanu et al. | |
| 2008/0081434 A1 | 4/2008 | Nam et al. | |
| 2009/0020847 A1 | 1/2009 | Byun et al. | |
| 2009/0053895 A1 | 2/2009 | Oshima et al. | |
| 2009/0104789 A1 | 4/2009 | Mallick et al. | |
| 2009/0104790 A1 | 4/2009 | Liang | |
| 2010/0109155 A1 | 5/2010 | Liu et al. | |
| 2010/0167533 A1 | 7/2010 | Lim et al. | |
| 2011/0151678 A1 | 6/2011 | Ashtiani et al. | |
| 2012/0149213 A1 | 6/2012 | Nittala et al. | |

OTHER PUBLICATIONS

Lang et al., "CVD Flowable Gap Fill," Novellus Systems, Inc., U.S. Appl. No. 11/323,812, filed Dec. 29, 2005, pp. 1-21.
Notice of Allowance and Fee Due mailed Feb. 15, 2006 from U.S. Appl. No. 10/810,066.
Allowed Claims from U.S. Appl. No. 10/810,066.
Gauri et al., "Flowable Film Dielectric Gap Fill Process," Novellus Systems, Inc., U.S. Appl. No. 11/447,594, filed Jun. 5, 2006.
U.S. Office Action mailed Jun. 27, 2008, from U.S. Appl. No. 11/447,594.
U.S. Office Action mailed Oct. 26, 2007, from U.S. Appl. No. 11/323,812.
U.S. Office Action mailed Apr. 9, 2008, from U.S. Appl. No. 11/323,812.
U.S. Office Action mailed Oct. 9, 2008, from U.S. Appl. No. 11/323,812.
Wang, et al., "CVD Flowable Gap Fill," Novellus Systems, Inc., U.S. Appl. No. 11/925,514, filed Oct. 26, 2007.
Wang, et al., "Density Gradient-Free Gap Fill," Novellus Systems, Inc., U.S. Appl. No. 11/834,581, filed Aug. 6, 2007.
Notice of Allowance and Fee Due mailed Feb. 15, 2006 from U.S. Appl. No. 11/447,594.
Allowed Claims from U.S. Appl. No. 11/447,594.
U.S. Office Action mailed Nov. 4, 2008, from U.S. Appl. No. 11/925,514.
U.S. Office Action mailed Nov. 12, 2008, from U.S. Appl. No. 11/834,581.
Gauri et al., "Flowable Film Dielectric Gap Fill Process," Novellus Systems, Inc., U.S. Appl. No. 12/411,243, filed Mar. 25, 2009.
Notice of Allowance and Fee Due mailed Apr. 23, 2009 from U.S. Appl. No. 11/323,812.
Allowed Claims from U.S. Appl. No. 11/323,812.
U.S. Final Office Action mailed Jun. 17, 2009, from U.S. Appl. No. 11/925,514.
Notice of Allowance and Fee Due mailed Jul. 29, 2009 from U.S. Appl. No. 11/925,514.
Allowed Claims from U.S. Appl. No. 11/925,514.
Mui et al., "Flowable Oxide Deposition Using Rapid Delivery of Process Gases," Novellus Systems, Inc., U.S. Appl. No. 12/566,085, filed Sep. 24, 2009.
Lang et al., "CVD Flowable Gap Fill", Novellus Systems, Inc., U.S. Appl. No. 12/508,461, filed Jul. 23, 2009.
Chung, et al., "Flowable Oxide CVD Process for Shallow Trench Isolation in Silicon Semiconductor," Journal of Semiconductor Technology and Science, vol. 4, No. 1, Mar. 2004, pp. 45-51.
U.S. Final Office Action mailed Aug. 6, 2009, from U.S. Appl. No. 11/834,581.
U.S. Office Action mailed Dec. 18, 2009, from U.S. Appl. No. 11/834,581.
Wang et al., "CVD Flowable Gap Fill", Novellus Systems, Inc., U.S. Appl. No. 12/625,468, filed Nov. 24, 2009.
U.S. Final Office Action mailed Apr. 22, 2010, for U.S. Appl. No. 11/834,581.
U.S. Office Action mailed May 24, 2010, for U.S. Appl. No. 12/411,243.
U.S. Final Office Action mailed Sep. 13, 2010 for U.S. Appl. No. 12/411,243.
Notice of Allowance mailed Oct. 6, 2010 for U.S. Appl. No. 12/411,243.
Allowed Claims for U.S. Appl. No. 12/411,243.
Notice of Allowance mailed Nov. 18, 2010 for U.S. Appl. No. 12/508,461.
Allowed Claims for U.S. Appl. No. 12/508,461.
Notice of Allowance mailed Oct. 7, 2010 for U.S. Appl. No. 11/834,581.
Allowed Claims for U.S. Appl. No. 11/834,581.
Ashtiani et al., "Novel Gap Fill Integration," Novellus Systems, Inc., U.S. Appl. No. 12/964,110, filed Dec. 9, 2010.
Lang et al., "CVD Flowable Gap Fill", Novellus Systems, Inc., U.S. Appl. No. 13/031,077, filed Feb. 18, 2011.
Matsuura, M., et al., "Novel Self-Planarizing CVD Oxide for Interlayer Dielectric Applications," IEEE, 1994, pp. 117-120.
Hatanaka, M., et al., "$H_2O$-TEOS Plasma-CVD Realizing Dielectrics Having a Smooth Surface," IEEE, VMIC Conference, Jun. 11-12, 1991, pp. 435-441.
Sakaue, H., et al., "Digital Chemical Vapor Deposition of $SiO_2$ Using a Repetitive Reaction of Triethylsilane /Hydrogen and Oxidation," Department of Electrical Engineering, Hiroshima University, published Nov. 17, 1990, pp. L 124-L 127.
Nakano, M., et al., "Digital CVD of $SiO_2$," Extended Abstracts of the 21st Conference on Solid State Devices and Materials, Tokyo, 1989, pp. 49-52.

(56) References Cited

OTHER PUBLICATIONS

Noguchi, S., et al., "Liquid Phase Oxidation Employing O Atoms Produced by Microwave Discharge and Si(CH$_3$)$_4$," Extended Abstracts of the 19$^{th}$ Conference on Solid State Devices and Materials, Tokyo, 1987, pp. 451-454.

Chung, Sung-Woong, et al., "Novel Shallow Trench Isolation Process Using Flowable Oxide CVD for sub-100nm DRAM," IEEE, 2002, IEDM, pp. 233-236.

U.S. Office Action for U.S. Appl. No. 12/625,468 mailed Apr. 26, 2011.

Gauri et al., "Flowable Film Dielectric Gap Fill Process," Novellus Systems, Inc., U.S. Appl. No. 12/984,524, filed Jan. 4, 2011.

International Search Report and Written Opinion mailed Aug. 10, 2011 for Application No. PCT/US2010/059721.

U.S. Final Office Action for U.S. Appl. No. 12/625,468 mailed Oct. 14, 2011.

Wang, et al., "Density Gradient-Free Gap Fill," Novellus Systems, Inc., U.S. Appl. No. 12/986,070, filed Jan. 6, 2011.

U.S. Office Action for U.S. Appl. No. 12/986,070 mailed Nov. 25, 2011.

Danek, et al., "Premetal Dielectric Integration Process," Novellus Systems, Inc., U.S. Appl. No. 13/315,123, filed Dec. 8, 2011.

Nittala, et al., "Bottom Up Fill in High Aspect Ratio Trenches," Novellus Systems, Inc., U.S. Appl. No. 13/313,735, filed Dec. 7, 2011.

U.S. Appl. No. 13/461,287, filed May 1, 2012, entitled "CVD Flowable Gap Fill".

U.S. Appl. No. 13/607,511, filed Sep. 7, 2012, entitled "Flowable Oxide Deposition Using Rapid Delivery of Process Gases".

U.S. Appl. No. 13/493,936, filed Jun. 11, 2012, entitled "Flowable Oxide Film With Tunable Wet Etch Rate".

US Office Action, dated May 18, 2012, issued in U.S. Appl. No. 12/984,524.

US Final Office Action, dated Sep. 14, 2012, issued in U.S. Appl. No. 12/984,524.

US Notice of Allowance, dated Aug. 6, 2012, issued in U.S. Appl. No. 13/031,077.

US Notice of Allowance, dated Jan. 31, 2012, issued in U.S. Appl. No. 12/625,468.

US Final Office Action, dated Jun. 25, 2012, issued in U.S. Appl. No. 12/986,070.

US Notice of Allowance, dated May 29, 2012, issued in U.S. Appl. No. 12/566,085.

US Office Action, dated Dec. 21, 2012, issued in U.S. Appl. No. 12/964,110.

US Office Action, dated Dec. 6, 2012, issued in U.S. Appl. No. 12/964,110.

Chinese Office Action mailed Jul. 20, 2012, issued in Application No. 200810187894.4.

\* cited by examiner

PECVD FLOWABLE DIELECTRIC GAP FILL

BACKGROUND OF THE INVENTION

This invention relates to electronic device fabrication processes. More specifically, the invention relates to chemical vapor deposition processes for forming dielectric layers in high aspect ratio, narrow width recessed features.

It is often necessary in semiconductor processing to fill a high aspect ratio gaps with insulating material. This is the case for shallow trench isolation, inter-metal dielectric layers, passivation layers, etc. As device geometries shrink and thermal budgets are reduced, void-free filling of high aspect ratio spaces (e.g., AR>8:1) becomes increasingly difficult due to limitations of existing deposition processes.

Most deposition methods deposit more material on the upper region than on the lower region of a sidewall and/or form top-hats at the entry of the gap. As a result the top part of a high aspect ratio structure sometimes closes prematurely leaving voids within the gap's lower portions. This problem is exacerbated in small features. Furthermore, as aspect ratios increase, the shape of the gap itself can contribute to the problem. High aspect ratio gaps often exhibit reentrant features, which make gap filling even more difficult. One such problematic reentrant feature is a narrowing at the top of the gap. The etched sidewalls slope inward near the top of the gap. For a given aspect ratio feature, this increases the ratio of gap volume to gap access area seen by the precursor species during deposition. Voids and seams formation is more likely under these conditions. If the top of the gap prematurely closes off, a chemical etch is required to re-open the gap before more film can be deposited in the gap.

One approach to gap fill is high-density plasma chemical vapor deposition (HDP CVD). HDP CVD is a directional (bottom-up) CVD process that is used for high aspect ratio gap-fill. The method deposits more material at the bottom of a high aspect ratio structure than on its sidewalls. It accomplishes this by directing charged dielectric precursor species downward, to the bottom of the gap. Nevertheless, some overhang or top-hat formation still results at the entry region of the gap to be filled. This results from the non-directional deposition reactions of neutral species in the plasma reactor and from sputtering/redeposition processes. The directional aspect of the deposition process produces some high momentum charged species that sputter away bottom fill. The sputtered material tends to redeposit on the sidewalls. Limitations due to overhang formation become ever more severe as the width of the gap to be filled decreases and the aspect ratio increases.

HDP CVD processes rely on plasma etch steps to remove sidewall deposits and top-hats. Typically a fluorine species, such as $NF_3$, is used between dielectric film deposition steps to etch the film. After a layer of dielectric partially fills gaps on a substrate, the fluorine-containing plasma etches the layer to remove top-hats and open the gap for further deposition. However, these etch steps may be inappropriate in some applications.

SUMMARY OF THE INVENTION

New methods of filling gaps with dielectric material are provided. The methods involve plasma-enhanced chemical vapor deposition (PECVD) of a flowable polymerized film in a gap, followed by an in-situ treatment to convert the film to a dielectric material. According to various embodiments, the in-situ treatment may be a purely thermal or plasma treatment process. Unlike conventional PECVD processes of solid material, which deposit film in a conformal process, the deposition results in bottom-up fill of the gap. In certain embodiments, a deposition-in situ treatment-deposition-in situ treatment process is performed to form dielectric layers in the gap. The sequence is repeated as necessary for bottom up fill of the gap. Also in certain embodiments, an ex-situ post-treatment process is performed after gap fill is completed. The PECVD methods of depositing a flowable film and treating (via in situ and in certain cases ex situ treatments) are tunable to obtain films having desired electrical and mechanical processes. For example, in certain embodiments, a film having a dielectric constant of less than 3.0 is formed. The processes are also applicable to frontend and backend gapfill.

DETAILED DESCRIPTION OF THE INVENTION

Introduction

The present invention relates to deposition processes that provide complete gap of fill high aspect ratio, narrow width gaps. According to various embodiments, the methods may be used to fill gaps having aspect ratios of 15:1 and higher, even at low thermal budgets.

Most deposition methods either deposit more material on the upper region than on the lower region of a sidewall or form cusps (also called top-hats) at the entry of the gap. To remove sidewall and top-hat deposits and keep the gap open for further deposition, conventional HDP CVD processes typically use a multi-cycle deposition process—etch process. Each cycle includes a deposition step followed by an etch step Typically, fluorine species are used in the etch step. These fluorine etch steps are costly and time-consuming, in some cases requiring multiple reactors.

Figure 1:
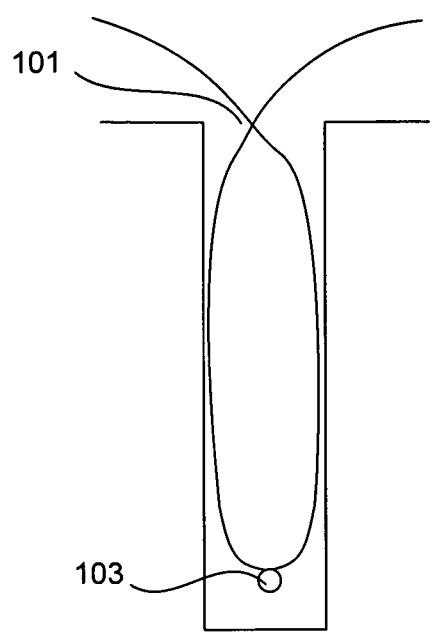
FIG. 1 is a rough schematic cross-sectional diagram of a trench partially filled by a conventional method.

FIG. 1 shows a rough schematic of a trench partially filled by a conventional HDP CVD method. Reference number 101 indicates where sidewalls have formed from film that has been sputtered away from the bottom of the trench and redeposited on the sidewalls of the trench. These sidewalls have pinched off preventing further deposition. A chemical etch is required to re-open the trench before dielectric film can be deposited in it. Multiple deposition-etch-deposition cycles are necessary to fill high aspect ratio trenches or other features. Reference number 103 indicates a weak spot. Conventional gap fill methods often lead to the formation of weak spots in the dielectric film. Weak spots may form as a result of the increased gap volume to gap access area as the gap closes off, and can lead to voids or seams in the gap and ultimately device failure. Other known methods of gap-fill also rely on multi-cycle deposition-etch steps and are susceptible to pinch-off at the top of the gap, and void and seam formation in the gap.

Because of these and other reasons, gap fill technology for shallow trench isolation (STI), pre-metal dielectric (PMD) and inter-layer dielectric (ILD) in logic and memory applications continues to be a challenge due to shrinking feature sizes. HDP or sub-atmospheric chemical vapor deposition (SACVD) may not be able to achieve the aspect ratios desired by the industry. For this reason, spin-on as well as complex schemes involving deposition, etch-back, and re-deposition are being explored. The latter is very expensive and complex, which is of course undesirable. Spin-on methods currently rely on chemistries such as polysilizanes which are coupled with long high temperature anneals to remove nitrogen content. The large thermal budget required for this process may be undesirable for certain applications.

The methods described herein provide bottom-up gap fill of high aspect ratio features. The methods are tunable to deposit films having desired electrical characteristics (e.g., dielectric constants as low as 2.7 or lower) or to increase mechanical properties. The methods are also flexible in that they may be used with low or high thermal budgets.

According to various embodiments, the methods involve a multistep process to create a flowable $SiO_2$ film using PECVD capable of filling high aspect ratio structures. During the PECVD deposition, the material deposited on the wafer has the ability to flow and will fill high aspect ratio features. After deposition, a thermal treatment, plasma treatment, ultraviolet thermal processing (UVTP) treatment, or another other process is applied to the film to remove carbon and enhance the mechanical properties. As described below, the curing process can be tailored for the thermal budget and desired properties of the film.

Process

Figure 2:
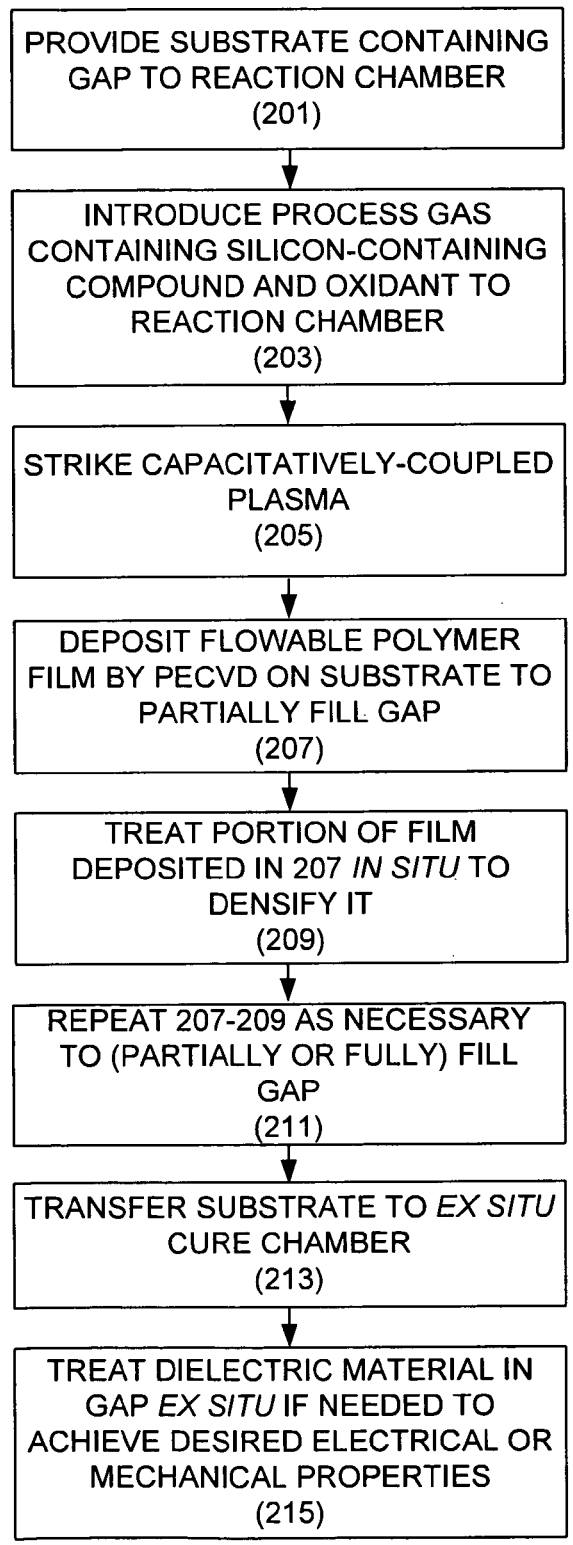
FIG. 2 is a process flow diagram depicting a method according to certain embodiments.

FIG. 2 is a process flow sheet depicting a method according to one embodiment of the present invention. As shown, a deposition process begins at an operation 201 in which a substrate containing a gap is provided to a reaction chamber. Providing the substrate to the reactor may involve clamping the substrate to a pedestal or other support in the chamber. For this purpose, an electrostatic or mechanical chuck may be employed.

After the substrate is provided to the reaction chamber, a process gas is introduced at an operation 203. The process gas includes a silicon-containing compound and an oxidant. The gas may also include one or more dopant precursors. Sometimes, though not necessarily, an inert carrier gas is present. In certain embodiments, the gases are introduced using a liquid injection system. The silicon-containing compound and the oxidant may be introduced via the same or separate inlets. A capacitatively-coupled plasma is struck at an operation 205 using a parallel plate RF plasma generator. A flowable polymeric film is then deposited in the gap to partially fill the gap at an operation 207. Conditions in the reactor are such that the silicon-containing compound and the oxidant react and condense on the substrate. (The method is not limited to a particular reaction mechanism, e.g., the reaction mechanism may involve a condensation reaction, a vapor-phase reaction producing a vapor-phase product that condenses, condensation of one or more of the reactants prior to reaction, or a combination of these.) The deposition process forms a viscous amorphous polymeric film having good flow characteristics, providing consistent fill.

Process conditions in the reactor are such that the reaction product condenses on the surface, which as described below, involves pedestal temperatures of 0-100° C. In certain embodiments, the as-deposited film contains Si—O, Si—OH, Si—CH$_3$ and Si—CH$_x$ bonds, with very few or substantially no Si—H bonds.

After the flowable film has been deposited in the gap, the as-deposited flowable film is converted to a solid silicon oxide dielectric film in an in situ operation 209. For the purposes of this application, in situ refers to being performed in the same reaction chamber as the deposition reaction, i.e., with no air break between the deposition and in situ treatment. The in situ treatment may be a plasma-based treatment or a purely thermal process. Other types of cure processes, including rapid thermal processing, ultra-violet flash cures, etc. may also be used. Because the process is in situ, in many embodiments, the treatment is a plasma-based treatment or a thermal anneal, both of which are well-suited to being performed in a PECVD deposition apparatus. The treatment may take place in an inert or oxidizing atmosphere. Specific treatments are discussed further below. Depending on the treatment, various quantities of carbon may remain in the film.

Figure 3:
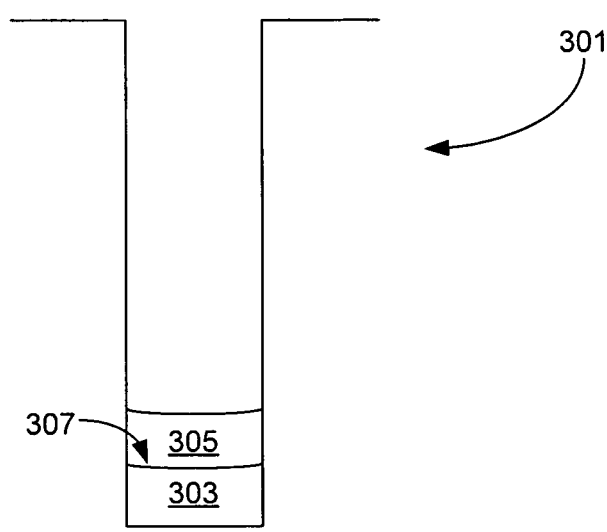
FIG. 3 is a rough schematic cross-sectional diagram of a trench partially filled by a method according to certain embodiments.

The deposition of the flowable film and the treatment process are then repeated as necessary to fill the gap. See block 211. In certain embodiments, it may also be necessary to strike a plasma prior to the deposition. In other embodiments, transitioning between treatment and deposition and vice versa may involve switching the silicon-containing precursor flow (and oxidant flow if desired) but otherwise maintaining the plasma. FIG. 3 shows a schematic of a high aspect ratio feature 301 after two deposition/treatment cycles. Layer 303 represents solid dielectric material formed in a first deposition/treatment cycle and layer 305 represents solid dielectric material formed in a second deposition/treatment cycle. An interface 307 is shown between the layers. Depending on the post-treatment process, there may be a detectable chemical signature at the interface. By depositing the film in a multi-cycle process as described (rather than in a single deposition operation), the subsequent treatment process can uniformly densify the as-deposited film; at high aspect ratios, this may be difficult to accomplish using a single cycle deposition. Further details of a multi-cycle process that deposits density-gradient free films may be found in U.S. patent application Ser. No. 11/834,581, incorporated by reference herein in its entirety. While FIG. 2 shows a multi-cycle deposition process, in certain embodiments, the film may be deposited in a single deposition operation and then converted to a solid material in one or more subsequent treatment operations. For example, for low aspect ratio films or processes that permit long or and/or high thermal budget curing processes, a single cycle may be used.

The deposition and treatment operations are repeated as necessary to fully fill the gap, or partially fill the gap to a desired endpoint. Because the process allows fine control over the thickness of film deposited, it allows a feature to be partially filled, e.g., to half the depth. This permits the remainder of the feature to be filled if desired with conventional HDP-based gap fill. In certain embodiments, the substrate has features of different aspect ratios. Deposition cycle time is then based on the highest aspect ratio feature and the desired number of cycles for that feature.

Due to the bottom-up nature of the process described in FIG. 2, the aspect ratio of a partially filled feature is less for the unfilled feature, permitting other conformal techniques that are not suitable for filling high aspect ratio features to be used. (This is unlike conformal processes, in which the aspect ration can remain even or increase.) In certain embodiments, the remainder of the gap is filled using conventional PECVD, which deposits a solid generally conformal film in the gap.

After the gap is filled with dielectric material, in certain embodiments, the substrate is then transferred to an ex situ curing chamber in an operation 213. As used herein, ex situ refers to outside of the deposition chamber. There, an ex situ treatment process is performed in an operation 215. This operation may serve to do any of further densifying the film, removing carbon, increasing mechanical strength, and lowering the dielectric constant. According to various embodiments, UV-assisted thermal processing, high temperature thermal annealing, rapid thermal processing or other flash curing is used.

In certain embodiments, the surface may be pre-treated with an agent to make it more attractive to flowable films. This may take place in the deposition chamber (i.e., between operations 201 and 203 in the flow chart of FIG. 2), or prior to being placed in the deposition chamber. In certain embodiments, the pre-treatment involves exposing the substrate to a plasma treatment process, such as $H_2$, $NH_3$, or $O_2$ plasma treatment. In other embodiments, a chemical pre-treatment such as exposing the substrate to a silazane vapor, e.g., HMDS, may be performed.

In many of the embodiments described herein, a cyclic deposition (deposition-treatment-deposition-treatment, etc.) process is described. As indicated in the discussion above of FIG. 3, an interface between the film deposited in each cycle results. Having multiple layers has been found in certain embodiments to achieve high quality film. In certain embodiments, a filled feature contains at least two such interfaces, at least three such interfaces, or at least four such interfaces. Each layer may be separated converted from as-deposited polymer to a fairly high quality oxide with a low wet etch rate prior to deposition of the next layer, without having convert/ densify the entire gap all at once. Because material in the gap is converted prior to the post treatment, the post treatment further enhances the mechanical and chemical properties near the top of the feature. Also in certain embodiments, the plasma deposition process employs a pulsed RF plasma. This has the effect of increasing the number of interfaces and film quality.

Process Parameters
Process Gas

The process gas contains a silicon-containing compound and an oxidant. Suitable silicon-containing compounds are compounds for which plasma polymerization reactions are possible and include organo-silanes and organo-siloxanes. In certain embodiments, the silicon-containing compound is a commonly available liquid phase silicon source. Examples include, but are not limited to, TOMCTS, OMCTS, TEOS, tri-ethoxy silane (TES), TMS, MTEOS, TMOS, MTMOS, DMDMOS Diethoxy silane(DES), triphenylethoxysilane, 1-(triethoxysilyl)-2-(diethoxymethylsilyl)ethane, tri-t-butoxylsilanol, tetramethoxy silane, and. Particular examples include tetramethylsilane (4MS), tetraethoxysilane (TEOS) and octamethyltetrasiloxane (OMCTS). Examples of suitable oxidants include ozone, hydrogen peroxide, oxygen, water, and alcohols such as methanol, ethanol, isoproponal.

In some embodiments, the silicon-containing compound and the oxidant are delivered to the reaction chamber via liquid injection system that vaporizes the liquid for introduction to the chamber. The reactants are typically delivered separately to the chamber. Typical flow rates of the liquid introduced into a liquid injection system range from 0.1-5.0 mL/min per reactant. Of course, one of skill in the art will understand that optimal flow rates depend on the particular reactants, desired deposition rate, reaction rate and other process conditions. Acceptable oxidant:silicon-containing compound ratios range from 2:1 to 1:3.

Deposition Reaction Conditions

Reactions conditions are such that the silicon-containing compound and oxidant, undergo a condensation reaction, condensing on the substrate surface to form a flowable film. As indicated above, the methods are not limited by a particular reaction mechanism. Temperatures are lower than typical PECVD reactions.

Substrate temperature is typically between about 0 and 100 C. Substrate temperature necessary to deposit a flowable film depends in part on the precursor used. Colder temperatures result in a more liquid-like film, as aspect ratios increase, the temperature is lowered to achieve the requisite liquidity to fill the feature. Chamber pressure may be between about 0.5-10 Torr, in certain embodiments, it is between 0.5 and 5 Torr. In a particular embodiment the chamber pressure is about 1 Torr.

As discussed further below, Applicants discovered that the use of plasma during deposition with certain precursors unexpectedly allows the deposition to be performed at higher temperatures than possible with thermal CVD. In certain embodiments, temperature is between about 60 and 100 C, e.g. 90 C. For TEOS, for example, thermal-only CVD does not deposit gel-like films at these higher temperatures. For TEOS, the maximum temperature that a flowable film can be deposited using thermal-only CVD is around room temperature (20-25 C). Other precursors such as tetramethylsilane (4MS), trimethylsilane (3MS), HMDSO, SiH4 can be used to deposit a flowable film using thermal CVD but at temperatures much lower than room temperature. In these cases, you generally need a <0 C pedestal to deposit a flowable film. However, at higher temperatures, e.g., 75 C, using a plasma, a flowable film is deposited.

Accessing a higher temperature regime with plasma-enhanced CVD is unexpected because plasma-enhanced processes typically operate in lower temperature regimes than thermal only processes due to the increased energy provided by the plasma. Moreover, in certain embodiments, the methods described herein produce flowable films having a polymeric structure. This is unlike flowable films deposited by low temperature thermal CVD processes in which the films are not polymerized.

In certain embodiments, precursor selection, temperature range and use of plasma results a polymerization reaction that deposits an amorphous polymeric gel on the surface. Previous processes, using low temperature thermal only processes, do not provide polymerization reactions. In certain embodiments, the polymeric structure of the plasma-enhanced deposited films described herein provides greater opportunity to modify the film as needed to obtain desired mechanical and electrical properties after deposition. This is because polymeric films can be cross-linked by in situ and ex-situ treatment processes.

As indicated above, the PECVD processes allow deposition at much higher temperatures than CVD processes in dark conditions. This provides various benefits that are not obtainable with prior processes. Particles that exist in the reactor will stick to the coldest surface. Front and backside contamination can be a significant problem in these cold processes. Cleaning these cold pedestal reactors can also be very difficult; difficulties that are mitigated or avoided by the plasma-enhanced processes described herein.

In addition to these hardware benefits, the present processes provide greater film uniformity in certain embodiments. Mass transport and thermal boundary conditions in the chamber are important factors determining the uniformity of the deposited film for both thermal CVD and PECVD processes. However, the uniformity of the plasma in PECVD also strongly influences film uniformity. The plasma can significantly improve the cross-wafer uniformity because it can smooth out defects in mass transport or thermal gradients. As a consequence the hardware becomes a bit more forgiving.

In particular embodiments using TEOS, OMCTS and TOMCTS at plasma-enhanced CVD reactions with oxygen at between about 60 C-100 C results in a polymerization reaction. A simple example of a polymerization reaction that occurs in certain embodiments in which OMCTS is the precursor is:

$[SiO(CH_3)_2]_4 + O_2 + RF\ energy \rightarrow \overline{\ }[SiO(CH_3)_2]\overline{\ }_N$ where N is the degree of polymerization. This is just an example of one reaction that may take place; as discussed further below, the gel has polymers of many different lengths in many embodiments. The polymers may be branched or linear. The length of the polymer chains may vary substantially with many branches composed of monomer segments or even smaller fragments created in the plasma. In similar manners, other precursors including TOMCTS and TEOS are polymerized to form branched or linear polymer chains including $\overline{\ }[SiOR]\overline{\ }_N$ (with R being one or more alkyl groups).

As-deposited film composition is discussed further below.

Exposure time depends on reaction conditions as well as the desired film thickness. Deposition rates are typically from about 100 angstroms/min to 1 micrometer/min. As discussed above, in many embodiments, a gap is only partially filled during a deposition cycle. In addition to exposure time, the amount of film deposited during a cycle may be tuned using temperature.

RF power should be sufficient to strike a plasma under the above-described conditions. A high frequency RF (between 2-60 MHz, e.g., about 13.56 MHz) source is used. Low frequency RF should not be used during the deposition of the flowable material. This is because excessive ion bombardment significantly alters the manner in which the material conforms to the surface during deposition. (After the deposition phase is completed, ion bombardment is acceptable and perhaps desirable to enhance the density of the as deposited polymer. A low frequency source (between about 100 kHz-1 MHz, e.g, 400 kHz) may be used then to supply 10-20% of total power.)

As-Deposited Film Composition

Figure 4:
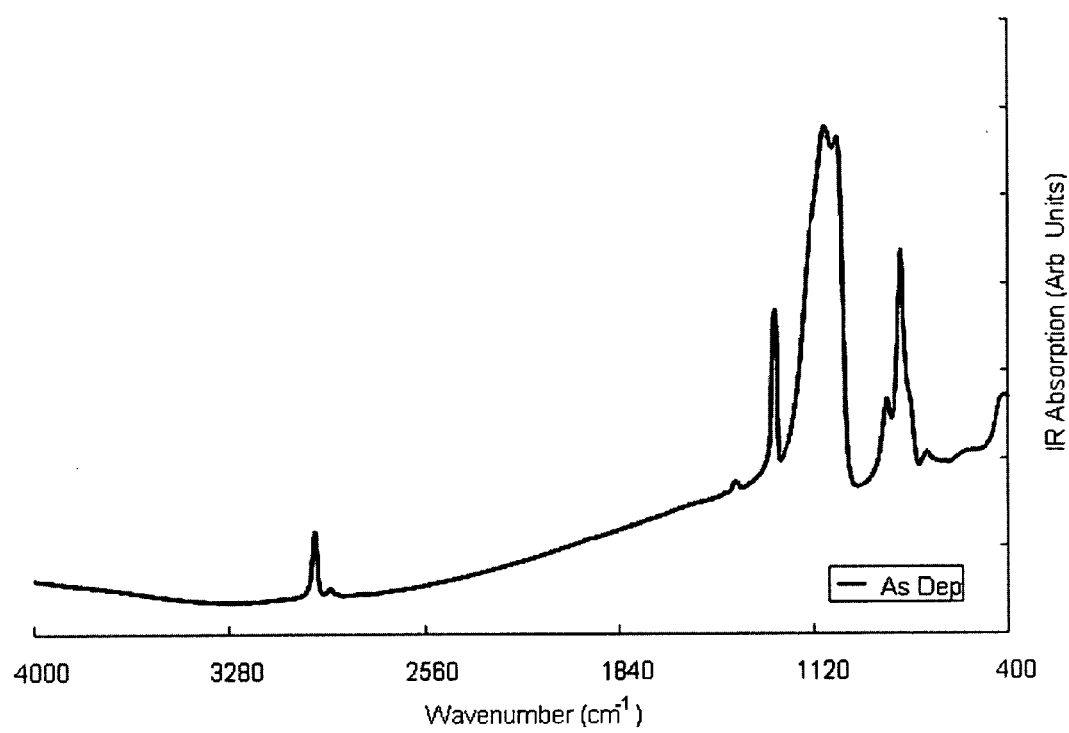
FIG. 4 shows an FTIR spectrum of a flowable film as deposited via a PECVD process according to certain embodiments.

FIG. 4 shows an FTIR spectrum of a flowable film as deposited via a PECVD process as described above. Si—$CH_x$ peaks are a cluster in the region of 3100 $cm^{-1}$ to 2800 $cm^{-1}$, for x=2 or 3 from CH2 and CH3 groups. The Si—O peaks are a cluster from 1250 $cm^{-1}$ to 950 $cm^{-1}$ (there are three principle peaks: a peak at about 1135 $cm^{-1}$ (cage), a peak at about 1063 $cm^{-1}$ (network), and a peak at about 1023 $cm^{-1}$ (sub-oxide). The Si—O area is all of these combined. The ratio of the Si—$CH_x$ peaks to the Si—O peaks is approximately 4%. The ratio of the Si—$CH_3$ peak at 1273 $cm^{-1}$ to the Si—O peaks is approximately 7%.

The as-deposited film may be characterized as a gel-like amorphous polymer, having a melting transition but no clear glass transition. Mechanical properties of the film as-deposited are fairly weak, e.g., for the film characterized by the spectrum shown in FIG. 4, the hardness and modulus were 0.09 GPa and 1.79 GPa, respectively.

Figure 5A:
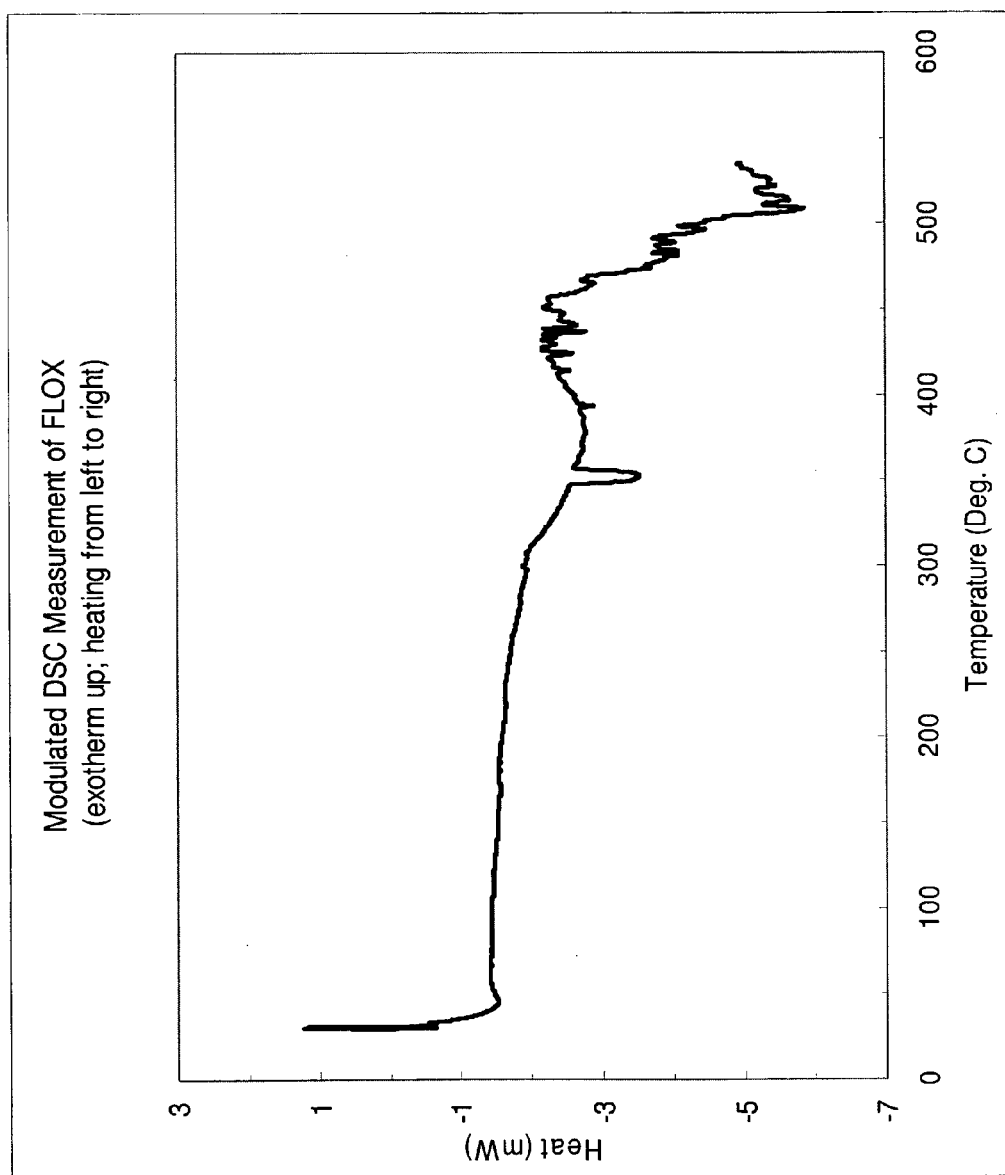
FIG. 5A is a plot showing a thermal gravimetric analysis of an as-deposited flowable film deposited by a plasma-assisted reaction.
Figure 5B:
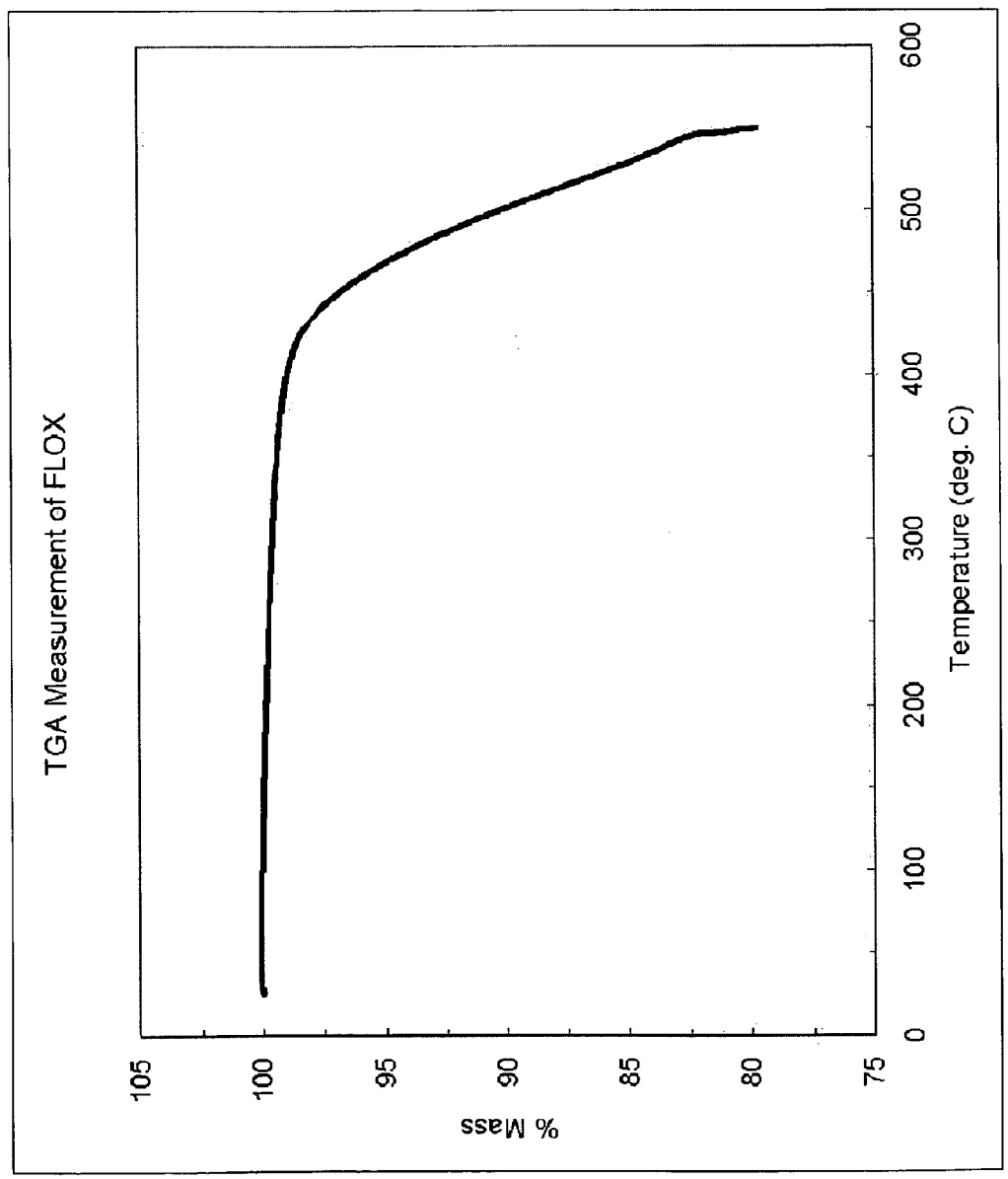
FIG. 5B is a plot showing a digital scanning calorimetry analysis of an as-deposited flowable film deposited by a plasma-assisted reaction.

FIGS. 5A and 5B show thermal gravimetric and digital scanning calorimetry analyses of the as-deposited film, respectively. These show that the film may be characterized as a multiphase (multiple chain lengths) amorphous polymer. No crystallization is observed and the range of melting point temperatures indicates that the chain length of the polymer chains varies.

In Situ Treatment

After the flowable film is deposited on the substrate, it is solidified and shrunk by treating it. As described above, in many embodiments, this is done in the same chamber (and may be done in the same station in a multi-station chamber) as the deposition process. Performing deposition and treatment operations in the same chamber facilitates the multi-cycle deposition/treatment described above.

According to various embodiments, the film may be converted to a solid oxide film by purely thermal anneal or exposure to a plasma. Thermal anneal temperatures may be 300 C or greater (depending on thermal budget). The anneal may be performed in an inert environment (Ar, He, etc.) or in a potentially reactive environment. Oxidizing environments (using $O_2$, $N_2O$, $O_3$, $H_2O$, $H_2O_2$, etc. may be used, though in certain situation nitrogen-containing compounds will be avoided to prevent incorporation of nitrogen in the film).

In certain embodiments, the film is treated by exposure to a plasma. This results in a top-down conversion of the flowable film to a solid film. The plasma may be inert or reactive. Helium and argon plasma are examples of inert plasmas; oxygen and steam plasmas are examples of oxidizing plasmas (used for example, to remove carbon as desired). Nitrogen-containing plasmas should be avoided if the incorporation of nitrogen in the resulting dielectric film is undesirable. Temperatures during plasma exposure are typically about 200 C or higher. In certain embodiments, an oxygen or oxygen-containing plasma is used to remove carbon.

Temperatures during the in situ process may range from 0-550 C, with the upper end of the temperature range determined by the thermal budget at the particular processing stage. Pressures may be from 0.1-10 Torr, with high oxidant pressures used for removing carbon.

Other annealing processes, including rapid thermal processing (RTP) may also be used to solidify and shrink the film during the in situ treatment. Table 1, below, shows results of an in situ plasma treatment (13.56 MHz; 1500 W HFRF power) in an oxidizing environment with a pressure of 1.5 Torr and a pedestal temperature of 200 C.

TABLE 1

| | | | | | | | |
|---|---|---|---|---|---|---|---|
| | | | In Situ Plasma Treatment | | | | |
| Cure Tme min | Gas — | Gas Flow sccm | He Flow sccm | Shrinkage % | Stress MPa | Removal SiCHx/SiO % | Removal SiCH3/SiO % |
| 1 | $O_2$ | 200 | 2000 | 13.5 | 37.4 | 40.1 | 42.9 |
| 1 | $O_2$ | 2000 | 2000 | 23.1 | 53.5 | 68.1 | 68.3 |
| 1 | $N_2O$ | 15000 | 0 | 13.2 | 40.6 | 50.9 | 53.3 |

The in situ oxidizing plasma treatment successfully reduced the amount of carbon in the material as measured by FTIR.

The in situ treatment between the deposition operations in a multi-cycle operation condenses the gel to a solid, and, depending on the desired properties of the resulting dielectric, may also remove carbon and densify the film. In certain embodiments where thermal oxide (SiO Ex Situ Treatment In certain embodiments, an ex situ process is performed after the gap is filled to completely densify and remove carbon from the film. Because the ex situ treatment is performed on a different tool than the deposition, higher temperatures and other sources of energy may be employed. Ex situ treatments include high temperature anneals (700-1000 C) in an environment such as $N_2$, $O_2$, $H_2O$ and He.

In certain embodiments, the ex situ treatment involves exposing the film to ultra-violet radiation, e.g., in a ultraviolet thermal processing (UVTP) process. For example, temperatures of 400 C or above in conjunction with UV exposure may be used to cure the film. Other flash curing processes, including RTP, may be used for the ex situ treatment as well.

Table 2, below, shows results of UVTP processing in oxygen with pedestal temperatures of 400 C.

TABLE 2

Ex Situ UVTP Treatment

| Cure Time Min | Pressure Torr | Shrinkage % | Stress MPa | Removal SiCHx/SiO % | Removal SiCH3/SiO % | Hardness GPa | Modulus GPa |
|---|---|---|---|---|---|---|---|
| 5 | 50 | 14.8 | 94.1 | 78.4 | 59.6 | — | — |
| 10 | 50 | 21.5 | 113.2 | 85.0 | 69.3 | — | — |
| 15 | 50 | 27.2 | 122.6 | 90.8 | 77.9 | — | — |
| 5 | 650 | 24.4 | 110.8 | 89.6 | 76.9 | 1.46 | 11.59 |
| 10 | 650 | 29.0 | 104.8 | 100 | 100 | 1.74 | 20.13 |
| 15 | 650 | 33.1 | 94.8 | 100 | 100 | 1.64 | 20.65 |

The high pressure (650 Torr) process provided the highest level of carbon removal. In one example, a 15 minute UVTP treatment in oxygen at 650 Torr produced a film having a hardness of this film almost 15 times that of the as-deposited. Notice that a one minute $N_2O$ plasma treatment removes almost as much carbon as a five minute UVTP treatment.

As discussed above, the processes described herein may be tuned to obtain certain desired electrical and/or mechanical properties. In certain embodiments, a dielectric constant of less than about 3.0 is obtained. The methods include an ex situ UVTP, thermal or e-beam process performed in a non-reactive ambient gas such as He, Ar, etc. An example of the results of such a cure process at different exposure times on a flowable film is provided in Table 3. Pedestal temperature was 400 C.

TABLE 3

Ex Situ UVTP Treatment and Dielectric Constant

| Cure Time min | Shrinkage % | Stress MPa | Removal SiCHx/SiO % | Removal SiCH3/SiO % | k | Hardness GPa | Modulus GPa |
|---|---|---|---|---|---|---|---|
| 5 | 17.58 | 56.40 | 49.82 | 36.72 | 2.72 | 0.53 | 3.70 |
| 10 | 24.36 | 67.23 | 61.86 | 48.89 | 2.69 | 0.94 | 6.25 |
| 15 | 27.75 | 66.33 | 69.36 | 57.28 | 2.75 | 1.16 | 8.33 |

The dielectric constant of the film is on the order of 2.75 and the elastic modulus and hardness are much improved over the as-deposited material. The observed shrinkage and stress are similar to other low-k processes currently in high volume production. These films have electrical properties which are much lower than achievable with current HDP $SiO_2$ or SiOF technology. Thus, using the methods described herein, it is possible to obtain dielectric films in high aspect ratio features that have dielectric constants of less than 3.0, or even less than 2.8 or 2.7 in certain embodiments.

Applications

The methods described herein may be for various applications including shallow trench isolation (STI), pre-metal dielectric (PMD), inter-level dielectric (ILD) and inter-metal dielectric (IMD) applications.

According to various embodiments, ex-situ treatments are tailored for the particular application. For example, in one embodiment the methods are used in an STI process. In the STI process, a shallow trench on the substrate, and then a flowable film is deposited therein to fill the trench with dielectric material. Conventional processes typically use HDP-CVD for STI. Aspect ratios of the may be as high as 10:1 or higher. After the film is deposited, in certain embodiments, a high temperature ex situ treatment is performed, e.g., a furnace anneal or rapid thermal processing using temperatures as high as 1000 C.

In another embodiment, the flowable film deposition process is used in a PMD or ILD process. After the requisite number of cycles of deposition and in situ treatment, the film is treated via a UVTP process. Alternatively, the film is treated via a low temperature (400-500 C) thermal anneal. These processes produce dielectric films having the desire properties at lower thermal budgets required.

In another embodiment, the processes are used in backend gapfill technologies for aluminum subtractive processes. Aluminum subtractive metallurgy currently relies on high density plasma (HDP) $SiO_2$ or SiOF films to fill high aspect ratio features. These films have a relatively high dielectric constant on the order of 3.7. The addition of fluorine to the film besides altering the dielectric constant can create a number of integration issues such as delamination.

Apparatus

The methods of the present invention may be performed on a wide-range of reaction chambers. The methods may be implemented on any chamber equipped for deposition of dielectric film, including HDP-CVD reactors, PECVD reactors, any chamber equipped for CVD reactions, and chambers used for PDL (pulsed deposition layers).

Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). While in process, each wafer is held in place by a pedestal, wafer chuck and/or other wafer holding apparatus. For certain operations in which the wafer is to be heated, the apparatus may include a heater such as a heating plate.

In certain embodiments, the present invention may be implemented in a HDP CVD reactor. An example of a suitable reactor is the Speed™ reactor, available from Novellus Systems of San Jose, Calif. In certain embodiments, the present invention may be implemented in a PECVD reactor. Examples of suitable reactors are the Sequel™ reactor and the Vector™ reactor, both available from Novellus Systems of San Jose, Calif. In certain embodiments, the present invention may be implemented in a CVD chamber equipped for metal and/or dielectric deposition. An example of a suitable reactor is the Altus™ reactor available from Novellus Systems of San Jose, Calif. In certain embodiments, the present invention may be implemented in a chamber equipped for atomic layer deposition (ALD), pulsed deposition layer (PDL), or pulsed nucleation layer (PNL) reactions. An example of such a reactor is the Altus™ with PNL reactor available from Novellus Systems of San Jose, Calif.

In certain embodiments, the deposition and conversion operations are performed in the same reaction chamber. In other embodiments, the deposition may be performed in a first chamber and then transferred to a second chamber for a thermal or plasma anneal. For example, reactors that are configured for plasma reactions may be used for both the deposition and plasma anneal operations. Other reactors may be used for deposition and thermal anneal operations.

Figure 8:
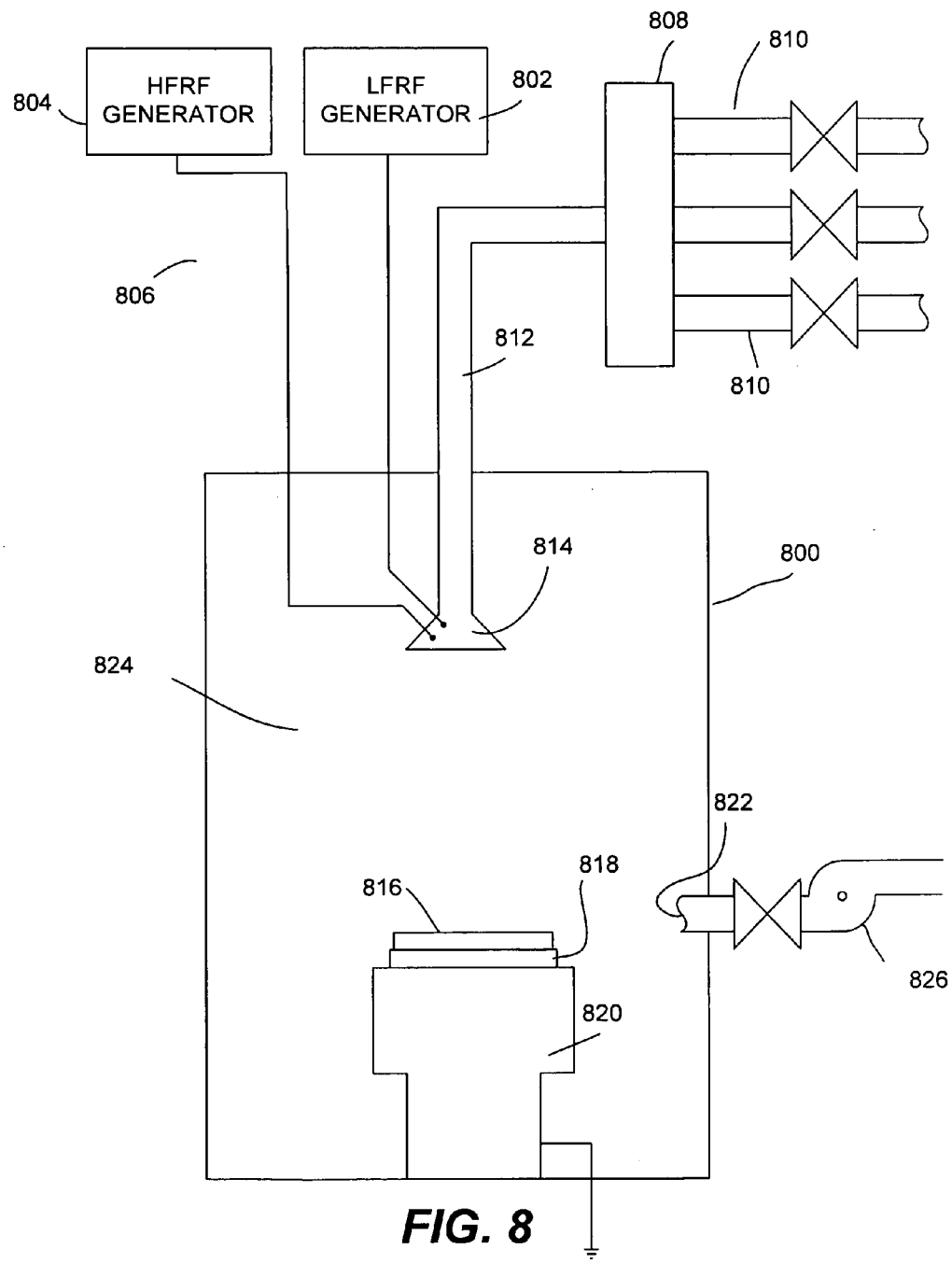
FIG. 8 depicts a reactor that may be used in accordance with certain embodiments of the invention.

FIG. 8 shows an example of a reactor that may be used in accordance with certain embodiments of the invention. The reactor shown in FIG. 8 is suitable for both the dark deposition and conversion to a solid film, for example, by plasma anneal. As shown, a reactor 800 includes a process chamber 824, which encloses other components of the reactor and serves to contain the plasma generated by a capacitor type system including a showerhead 814 working in conjunction with a grounded heater block 820. A low-frequency RF generator 802 and a high-frequency RF generator 804 are connected to showerhead 814. The power and frequency are sufficient to generate a plasma from the process gas, for example 400-700 W total energy. In the implementation of the present invention, the generators are not used during dark deposition of the flowable film. During the plasma anneal step, one or both generators may be used. For example, in a typical process, the high frequency RF component is generally between 2-60 MHz; in a preferred embodiment, the component is 13.56 MHz.

Within the reactor, a wafer pedestal 818 supports a substrate 816. The pedestal typically includes a chuck, a fork, or lift pins to hold and transfer the substrate during and between the deposition and/or plasma treatment reactions. The chuck may be an electrostatic chuck, a mechanical chuck or various other types of chuck as are available for use in the industry and/or research.

The process gases are introduced via inlet 812. Multiple source gas lines 810 are connected to manifold 808. The gases may be premixed or not. The temperature of the mixing bowl/manifold lines should be maintained at levels above the reaction temperature. Temperatures at or above about 80 C at pressures at or less than about 20 Torr usually suffice. Appropriate valving and mass flow control mechanisms are employed to ensure that the correct gases are delivered during the deposition and plasma treatment phases of the process. In case the chemical precursor(s) is delivered in the liquid form, liquid flow control mechanisms are employed. The liquid is then vaporized and mixed with other process gases during its transportation in a manifold heated above its vaporization point before reaching the deposition chamber.

Process gases exit chamber 800 via an outlet 822. A vacuum pump 826 (e.g., a one or two stage mechanical dry pump and/or a turbomolecular pump) typically draws process gases out and maintains a suitably low pressure within the reactor by a close loop controlled flow restriction device, such as a throttle valve or a pendulum valve.

It should be noted that the apparatus depicted in FIG. 8 is but one example of an apparatus that may be used to implement this invention.

Experimental

The following examples provide details illustrating aspects of the present invention. These examples are provided to exemplify and more clearly illustrate these aspects of the invention and are in no way intended to be limiting.

Figure 6:
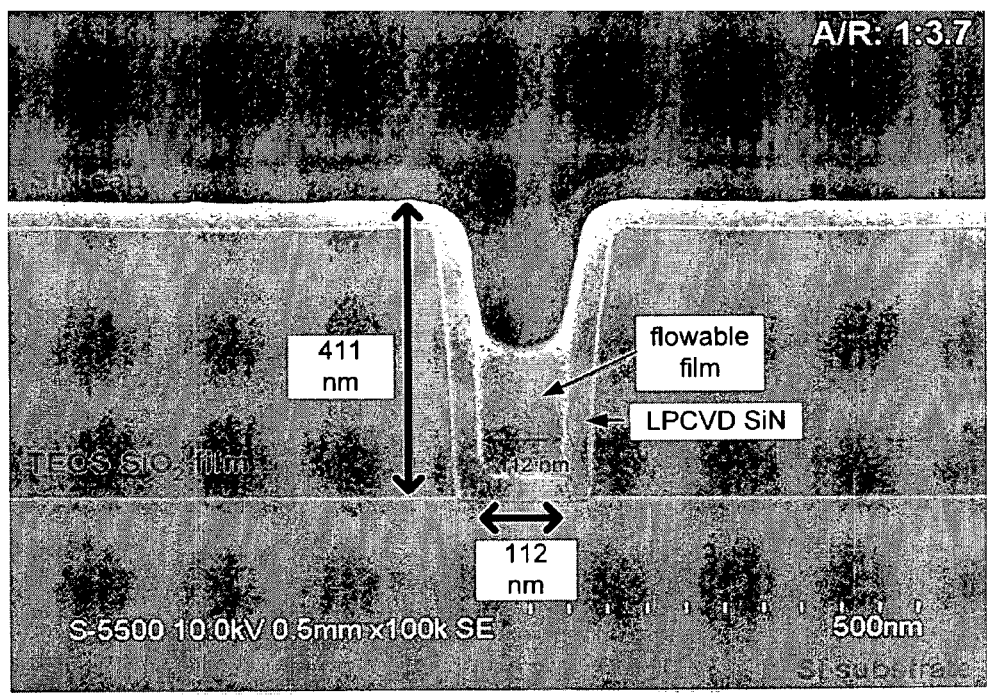
FIG. 6 shows an image of a feature partially filled by a method according to certain embodiments described herein.

OMCTS was used as the precursor and $O_2$ the oxidizer in a ratio of 2:1. For this process, the reactor pressure was held at 2 T and a pedestal temperature of <200 C. A 13.65 MHz radio frequency source was used to excite the plasma. This wafer had a LPCVD SiN film grown on top of a patterned TEOS $SiO_2$ film. (The flowable film material was capped with a PECVD SiN film to allow etching after cross-sectioning the sample to achieve better contrast in the SEM.) FIG. 6 shows an image of an intentionally partially filled feature. The flowable film is clearly visible at the bottom of the trench. The material does not deposit in a conformal fashion as PECVD films do in general. Instead, the flowable fill has the characteristics of bottom up fill (BUF)—similar to a copper electroplating process.

Figure 7:
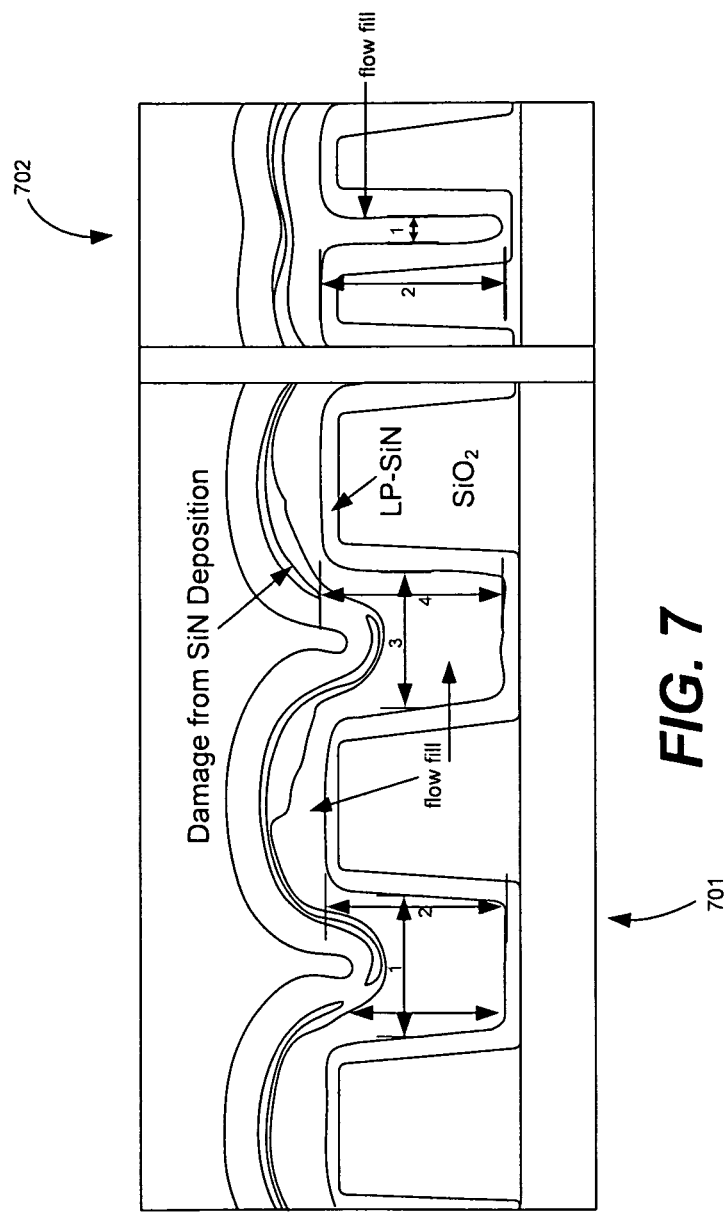
FIG. 7 shows images of two flowable films deposited in trenches by methods according to certain embodiments described herein.

FIG. 7 shows two cross-sectional images 701 and 702 of flowable films deposited in trenches. As can be seen, the film is capable of filling high aspect ratio features (e.g., the feature in image 702 has an AR of 8:1) normally filled by HDP.

Figure 9:
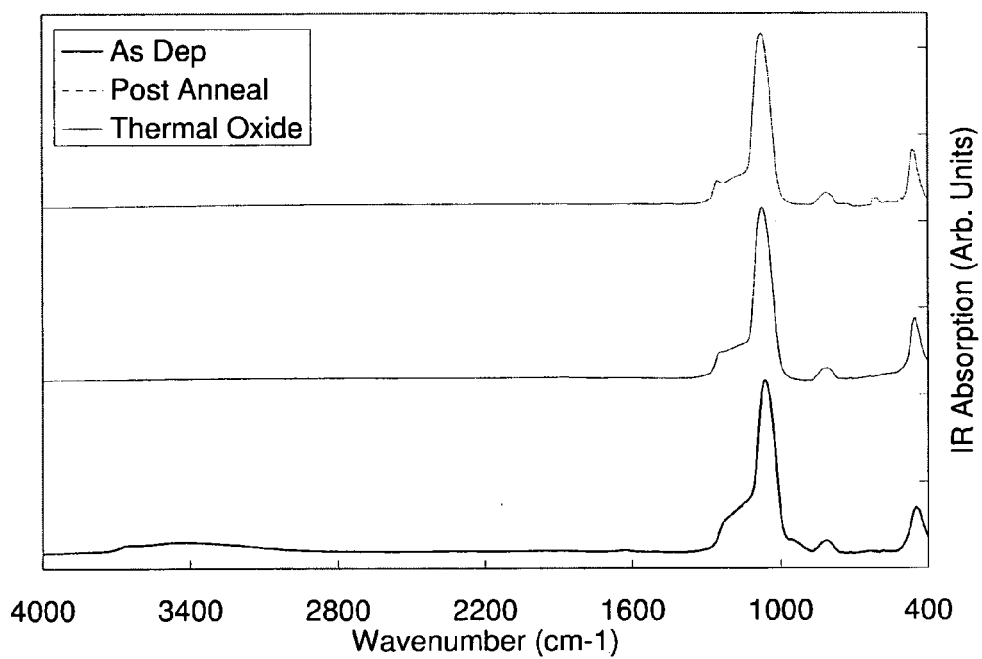
FIG. 9 is a plot showing FTIR spectra of a flowable film deposited in deposit-in situ treatment-deposit-in situ treatment process as-deposited and after an ex situ anneal, as compared to a reference thermal oxide (SiO2) film.

FIG. 9 shows FTIR spectra of 1) a flowable film deposited in another deposit-in situ treatment-deposit-in situ treatment process using OMCTS as the silicon-containing precursor with an O2 plasma (HF RF power only) followed by He plasma (HF and LF RF power), 2) the film after a ex situ anneal of 30 min at 700 C in dry air and 3) a reference thermal oxide (SiO2) film created by steam annealing a silicon wafer at 900 C. As the figure shows, the flowable material has been converted to a material with IR absorptions bands nearly identical to that of thermal oxide. Note that the two step in situ treatment after each deposition provides two effects: the first treatment (O2 plasma, HF only RF) provides oxidation of the layer and the second treatment (He plasma, HF and LF RF) densifies the layer.

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. A method of filling gaps on a substrate with dielectric material comprising:
    placing the substrate in a reaction chamber;
    introducing a process gas comprising a silicon-containing compound and an oxidant into the reaction chamber, wherein the oxidant is selected from oxygen ($O_2$) and ozone ($O_3$);
    exposing the substrate to a plasma generated from the process gas under conditions, including a substrate temperature of between about 60° C. and 100° C., such that the silicon-containing compound and the oxidant plasma species react and condense such that an amorphous flowable organo-silicon polymer film is thereby deposited to partially fill the gaps via a substantially-high frequency-only HF capacitatively-coupled plasma-assisted reaction;
    converting the flowable film to a dielectric material via an in-situ treatment process; and
    repeating the exposure and conversion operations at least once to fill the gaps.

2. The method of claim 1 further comprising transferring the substrate to a cure chamber and performing an ex-situ treatment process.

3. The method of claim 2 wherein the in-situ and ex-situ treatment processes remove substantially all of the carbon from the as-deposited flowable organosilicon film.

4. The method of claim 2 wherein the ex-situ treatment process comprises an ultraviolet thermal processing operation at a substrate temperature of at least about 400° C.

5. The method of claim 2 wherein the ex-situ treatment process comprises an thermal processing operation at a substrate temperature of at least about 700° C.

6. The method of claim 1 wherein silicon-containing compound is an organo-silane or an organo-siloxane.

7. The method of claim 1 wherein at least one gap has an aspect ratio of at least bout 10:1.

8. The method of claim 1 wherein at least one gap has an aspect ratio of at least about 15:1.

9. The method of claim 1 wherein the in-situ treatment process comprises exposing the film to an inert plasma, wherein the inert plasma is generated only from inert gases.

10. The method of claim 9 wherein the in-situ treatment process comprises exposing the film to an oxidizing plasma.

11. The method of claim 1 wherein the in-situ treatment process removes at least some of the carbon from the flowable organosilicon film.

12. The method of claim 1 wherein exposing the substrate to the process gas under conditions such that a flowable organo-silicon polymer film is deposited to partially fill the gaps via a capacitatively-coupled plasma-assisted reaction comprises pulsing the RF frequency.

13. The method of claim 1 wherein the deposited film in the gap comprises interfaces between sequentially deposited layers in the gap.

14. The method of claim 13 wherein the film in each gap comprises at least four interfaces.

15. The method of claim 1 wherein the dielectric constant of the film is between about 2.7 and 3.0.

16. The method of claim 1 wherein the ratio of S—$CH_x$ peaks to the Si—O peak is approximately 4% of the as-deposited flowable organosilicon polymer.

17. The method of claim 1 wherein the ratio of S—$CH_3$ peak to the Si—O peak is approximately 7% of the as-deposited flowable organosilicon polymer.

18. The method of claim 1 further comprising pre-treating the substrate prior to depositing of the flowable film.

19. A method of filling gaps on a substrate with dielectric material comprising:
    introducing a process gas comprising a silicon-containing compound and an oxidant into the reaction chamber containing the substrate;
    exposing the substrate in an exposure operation to a plasma generated from the process gas under conditions such that an amorphous flowable organo-silicon polymer film is deposited to partially fill the gaps via a plasma-assisted reaction; and
    exposing the flowable organo-silicon polymer film in a treatment operation to an in-situ inert plasma, wherein the inert plasma is generated only from inert gases;
    repeating the exposure and treatment operations at least once to fill the gaps.

20. The method of claim 19 wherein the inert plasma is a He plasma.

21. A method of filling gaps on a substrate with dielectric material comprising:
    introducing a process gas comprising a silicon-containing compound and an oxidant into a reaction chamber housing the substrate, wherein the oxidant is selected from oxygen ($O_2$) and ozone ($O_3$);
    exposing the substrate to a plasma generated from the process gas under conditions such that the silicon-containing compound and the oxidant plasma species react and condense such that an amorphous flowable organo-silicon polymer film is thereby deposited to partially fill the gaps via a substantially-high frequency-only HF plasma-assisted reaction.

* * * * *